(12) United States Patent
Kawano

(10) Patent No.: US 11,244,931 B2
(45) Date of Patent: Feb. 8, 2022

(54) LIGHT EMITTING DEVICE WITH ENHANCED COLOR MIXING QUALITY

(71) Applicant: NICHIA CORPORATION, Anan (JP)

(72) Inventor: Yusuke Kawano, Anan (JP)

(73) Assignee: NICHIA CORPORATION, Anan (JP)

( * ) Notice: Subject to any disclaimer, the term of this patent is extended or adjusted under 35 U.S.C. 154(b) by 273 days.

(21) Appl. No.: 16/591,622

(22) Filed: Oct. 3, 2019

(65) Prior Publication Data

US 2020/0111766 A1 Apr. 9, 2020

(30) Foreign Application Priority Data

Oct. 4, 2018 (JP) .............................. JP2018-188988
Jul. 18, 2019 (JP) .............................. JP2019-132575

(51) Int. Cl.
| | |
|---|---|
| H01L 25/075 | (2006.01) |
| H01L 33/50 | (2010.01) |
| H01L 33/56 | (2010.01) |
| H01L 33/60 | (2010.01) |
| H01L 33/62 | (2010.01) |

(52) U.S. Cl.
CPC ........ *H01L 25/0753* (2013.01); *H01L 33/504* (2013.01); *H01L 33/56* (2013.01); *H01L 33/60* (2013.01); *H01L 33/62* (2013.01); *H01L 2933/005* (2013.01); *H01L 2933/0041* (2013.01); *H01L 2933/0058* (2013.01); *H01L 2933/0066* (2013.01); *H01L 2933/0091* (2013.01)

(58) Field of Classification Search
None
See application file for complete search history.

(56) References Cited

U.S. PATENT DOCUMENTS

| 10,910,523 B2 * | 2/2021 | Hung .................. H01L 21/6835 |
|---|---|---|
| 2015/0204494 A1 | 7/2015 | Wada et al. |
| 2015/0207045 A1 | 7/2015 | Wada et al. |
| 2015/0263254 A1 | 9/2015 | Miyoshi et al. |
| 2016/0161067 A1 | 6/2016 | Oepts et al. |
| 2016/0169460 A1 | 6/2016 | Suto et al. |

(Continued)

FOREIGN PATENT DOCUMENTS

| JP | 2009-111140 | 5/2009 |
|---|---|---|
| JP | 2012-009723 | 1/2012 |
| JP | 2013-077679 | 4/2013 |
| JP | 2013-120812 | 6/2013 |

(Continued)

*Primary Examiner* — Daniel Whalen
(74) *Attorney, Agent, or Firm* — Mori & Ward, LLP

(57) ABSTRACT

A light emitting device includes a first light emitting element having a top face and a bottom face which faces the base, and a second light emitting element. A wavelength conversion member is provided on the top face and includes a light transmitting part made of an inorganic material and a phosphor layer. The light transmitting part has an upper face and a lower face. A phosphor layer is disposed between the lower face and the top face. The phosphor layer is bonded to the top face of the first light emitting element. The reflecting member covers the lateral faces of the phosphor layer. A light transmissive sealing resin is disposed on the base between the first and second light emitting elements and between the wavelength conversion member and the second light emitting element. The light transmissive sealing resin covers the lateral faces via the reflecting member.

15 Claims, 12 Drawing Sheets

(56) References Cited

U.S. PATENT DOCUMENTS

| | | |
|---|---|---|
| 2016/0284950 A1 | 9/2016 | Tseng |
| 2016/0380165 A1 | 12/2016 | Miyoshi et al. |
| 2017/0033267 A1* | 2/2017 | Tamaki ................ H01L 33/508 |
| 2017/0084587 A1* | 3/2017 | Hung ..................... H01L 33/60 |
| 2017/0111972 A1 | 8/2017 | Oepts et al. |
| 2017/0278829 A1 | 9/2017 | Stoll et al. |
| 2017/0301839 A1 | 10/2017 | Miyoshi et al. |
| 2018/0003349 A1 | 1/2018 | Miyoshi |
| 2018/0033924 A1* | 2/2018 | Andrews .............. H01L 33/507 |
| 2018/0130776 A1 | 5/2018 | Oka |
| 2018/0315902 A1 | 11/2018 | Zhang et al. |
| 2018/0358336 A1 | 12/2018 | Oka |
| 2019/0013447 A1* | 1/2019 | Kawano ................ H01L 33/507 |
| 2019/0206847 A1 | 7/2019 | Oka |

FOREIGN PATENT DOCUMENTS

| | | |
|---|---|---|
| JP | 2013-182918 | 9/2013 |
| JP | 2013-219397 | 10/2013 |
| JP | 2014-225600 | 12/2014 |
| JP | 2015-126209 | 7/2015 |
| JP | 2015-138838 | 7/2015 |
| JP | 2015-138839 | 7/2015 |
| JP | 2015-188069 | 10/2015 |
| JP | 2016-531432 | 10/2016 |
| JP | 2017-033967 | 2/2017 |
| JP | 2017-523600 | 8/2017 |
| JP | 2017-531315 | 10/2017 |
| JP | 2017-228658 | 12/2017 |
| JP | 2018-011039 | 1/2018 |
| JP | 2018-014480 | 1/2018 |
| JP | 2018-078188 | 5/2018 |
| JP | 2018-535552 | 11/2018 |

* cited by examiner

LIGHT EMITTING DEVICE WITH ENHANCED COLOR MIXING QUALITY

CROSS-REFERENCE TO RELATED APPLICATIONS

The present application claims priority under 35 U. S. C. § 119 to Japanese Patent Application No. 2018-188988, filed Oct. 4, 2018, and Japanese Patent Application No. 2019-132575, filed Jul. 18, 2019. The contents of these applications are incorporated herein by reference in their entirety.

BACKGROUND

The present invention relates to a light emitting device.

In recent years, white light emitting devices which combine a light emitting element and a phosphor have been widely used. For example, Japanese Unexamined Patent Application Publication No. 2013-120812 discloses a light emitting device which includes a blue LED chip and a red emission part composed of a near-UV LED coated with a material containing a red emitting phosphor that are both covered with a first sealing material that contains a yellow emitting phosphor (FIG. 9 and Example 3 in the publication). According to this patent publication, the light emitting device disclosed is said to enhance color mixing quality and is able to reduce unevenness in the color of light it outputs.

SUMMARY

According to one aspect of an embodiment of the present invention, the light emitting device includes a base, a first light emitting element disposed on the base, a second light emitting element disposed on the base, a wavelength conversion member, a reflecting member, and a light transmissive sealing resin. The first light emitting element has a top face and a bottom face opposite to the top face. The bottom face faces the base. The wavelength conversion member is provided on the top face of the first light emitting element and includes a light transmitting part made of an inorganic material and a phosphor layer. The light transmitting part has an upper face and a lower face opposite to the upper face. The phosphor layer is disposed between the lower face of the light transmitting part and the top face of the first light emitting element. The phosphor layer is bonded to the top face of the first light emitting element. The reflecting member covers the lateral faces of the phosphor layer. The light transmissive sealing resin is disposed on the base between the first light emitting element and the second light emitting element and between the wavelength conversion member and the second light emitting element. The light transmissive sealing resin covers the lateral faces of the phosphor layer via the reflecting member.

According to another aspect of an embodiment of the present invention, the light emitting device includes a first light emitting element, a second light emitting element, a wavelength conversion member, a reflecting member, and a light transmissive sealing resin. The wavelength conversion member includes a light transmitting part and a phosphor layer. The light transmitting part is made of an inorganic material and has an upper face and a lower face. The phosphor layer is disposed on the lower face of the light transmitting part. The phosphor layer is bonded to the first light emitting element. The reflecting member covers lateral faces of the phosphor layer. The light transmissive sealing resin is disposed between the first light emitting element and the second light emitting element and between the wavelength conversion member and the second light emitting element. The light transmissive sealing resin supports the first light emitting element, the wavelength conversion member, and the second light emitting element and covers the lateral faces of the phosphor layer via the reflecting member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

EMBODIMENTS

Figure 1:
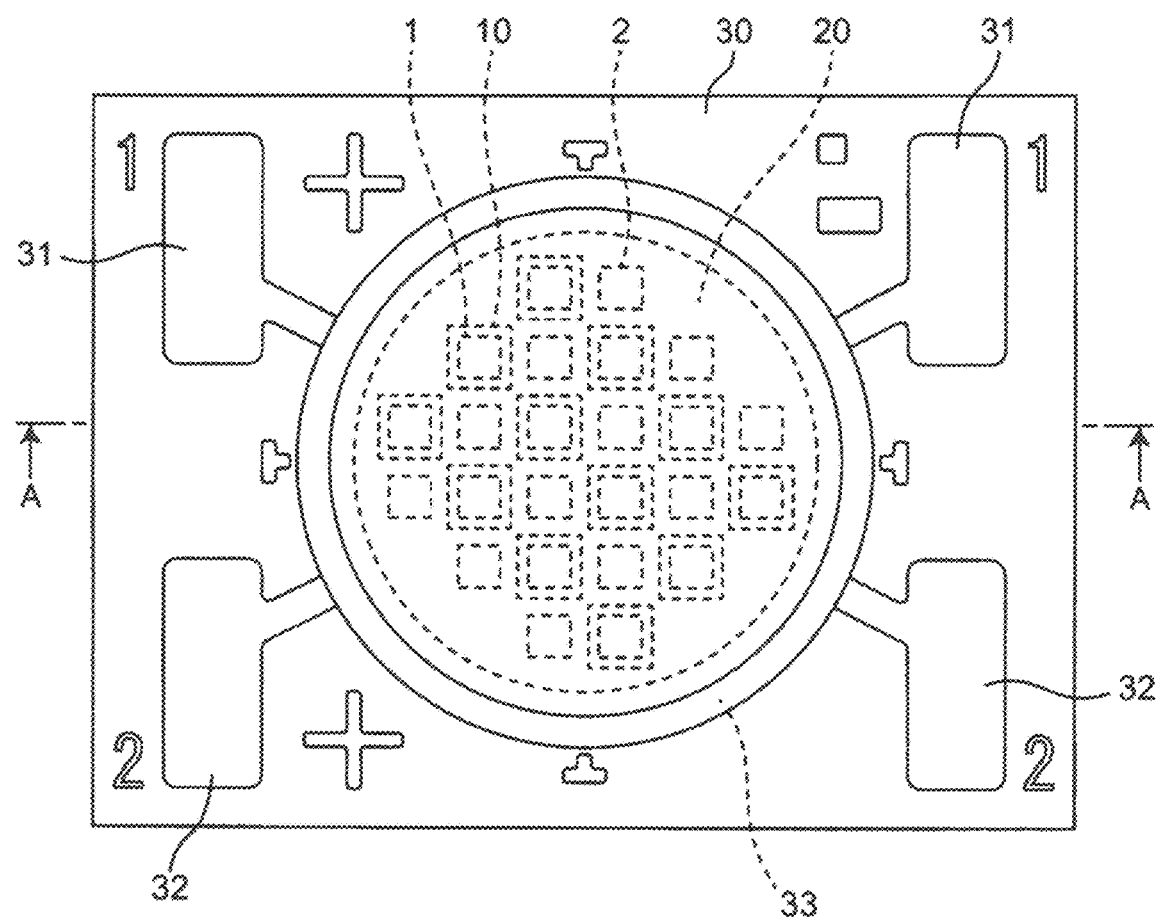
FIG. 1 is a top view of a light emitting device according to Embodiment 1.

The embodiments will now be described with reference to the accompanying drawings, wherein like reference numerals designate corresponding or identical elements throughout the various drawings.

Light emitting devices according to certain embodiments of the present invention will be explained below.

The light emitting devices explained below are for giving shape to the technical ideas of the present disclosure, and are not intended to limit the present invention to those disclosed below unless otherwise specifically noted.

Embodiment 1

Figure 2:
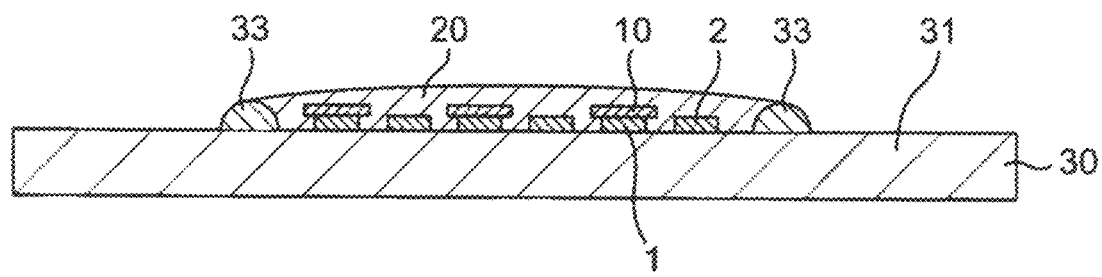
FIG. 2 is a cross-sectional view of the device in FIG. 1 taken along line A-A.

The light emitting device r of Embodiment 1, as shown in FIG. 1 and FIG. 2, includes a base 30, a plurality of first light emitting elements 1 disposed on the base 30, a plurality of second light emitting elements 2 disposed on the base 30, wavelength conversion members 10 individually disposed on the first light emitting elements 1, and a light transmissive sealing resin 20 disposed on the base 30 so as to collectively cover the second light emitting elements 2, the first light emitting elements 1, and the wavelength conversion members 10.

The wavelength conversion members 10 each include a light transmitting part 12 made of an inorganic material having an upper face and a lower face, and a phosphor layer 11 disposed on the lower face of the light transmitting part 12. Each phosphor layer 11 is bonded onto a first light emitting element 1.

The light emitting device of Embodiment 1 further includes a reflecting member 7 which covers the lateral faces of the phosphor layer 11.

The light transmissive sealing resin 20 is disposed on the base 30 between the first light emitting elements 1 and the second light emitting elements 2 and between the wavelength conversion members and the second light emitting elements 2 while covering the lateral faces of the phosphor layer via the reflecting member 7.

The light emitting device of Embodiment 1 constructed as above, including the reflecting member 7 that covers the lateral faces of the phosphor layer 11, can reduce the excitation of the phosphor layer 11 by the light from the second light emitting elements 2 thereby more effectively reducing unevenness in the color of the light.

The light emitting device of Embodiment 1 is being explained using the example shown in FIG. 1 and FIG. 2 which has a plurality of first light emitting elements 1 and a plurality of second light emitting elements 2 on the base 30. The present invention according to this embodiment, however, is not limited to this, and can simply have at least one first light emitting element and at least one second light emitting element on the base.

The light emitting device of Embodiment 1 will be more specifically explained below with reference to the drawings.

In the light emitting device of Embodiment 1, the base 30, for example, is a substrate having a flat upper face, and wiring is provided on the upper face of the base 30 to supply power to the first light emitting elements 1 and the second light emitting elements 2. The wiring disposed on the upper face of the base 30 includes first wiring 31 to supply power to the first light emitting elements 1 and second wiring 32 to supply power to the second light emitting elements 2. Furthermore, on the upper face of the base 30, a frame 33 is disposed to surround the mounting area where the first light emitting elements 1 and the second light emitting elements 2 are mounted. On the upper face of the base 30, in the mounting area inside the fame 33, a plurality of first light emitting elements 1 and a plurality of second light emitting elements 2 are disposed in the layout described below.

In the light emitting device of Embodiment 1, the planar shape of each of the first light emitting elements 1 and the second light emitting elements 2 when viewed from above is polygonal, such as substantially quadrilateral. The first light emitting elements 1 or the second light emitting elements 2 are arranged, for example, such that their centers coincide with the lattice points of a quadrilateral lattice. In other words, they are lined up along the direction substantially paralleling one of the two pairs of opposite sides of the quadrilateral lattice and the direction substantially paralleling the other pair of opposite sides of the lattice. In the description herein, the light emitting elements arranged in the direction substantially paralleling a pair of opposite sides of the quadrilateral lattice are referred to as rows, and the light emitting elements arranged in the direction substantially paralleling the other pair of opposite sides are referred to as columns. In the light emitting device of Embodiment 1, the first light emitting elements 1 and the second light emitting elements 2 disposed in rows and columns are alternately arranged in each row and each column. In this manner, four second light emitting elements 2 are arranged adjacently around a first light emitting element 1 and four first light emitting elements 1 are arranged adjacently around a second light emitting element 2. In the description herein, the term, substantially quadrilateral, used when describing the planar shape of a light emitting element means that each angle at four corners is 90 degrees with a tolerance of about plus/minus 5 degrees. Moreover, the term, substantially polygonal, used when describing the planar shape of a light emitting element mans that each angle of a regular polygon includes a tolerance of about plus/minus 5 degrees. The term, substantially parallel, used in the description herein includes a tolerance of about plus/minus 5 degrees. The spacing between the first light emitting elements 1 and the second light emitting elements 2 can be freely designed, but narrow spacing can enhance the color mixing quality. In the case of setting a small inter-element distance, for example, when the first light emitting elements 1 and the second light emitting elements 2 are substantially quadrilateral, the distance between two adjacent light emitting elements, i.e., between the opposing sides, can be set to 0.5 mm at most, more preferably 0.3 mm at most.

In the light emitting device of Embodiment 1, moreover, the first light emitting elements 1 and the second light emitting elements 2, from a perspective of circuit configuration, are arranged, for example, in a diagonal direction of the quadrilateral lattice. Specifically, the first light emitting elements 1 are arranged in odd number diagonal columns and the second light emitting elements 2 are arranged in even number diagonal columns. That is, the diagonal columns of the first light emitting elements and the diagonal columns of the second light emitting elements are alternated. There are two diagonal directions, but in the description herein, the even number diagonal columns and the odd number diagonal columns are those in the direction in which adjacent first light emitting elements and adjacent second light emitting elements are respectively connected.

The light emitting device of Embodiment 1 can, in addition to improving color mixing quality and reducing color unevenness by arranging a plurality of first light emitting elements 1 and a plurality of second light emitting elements 2 as described above, further improve the color mixing quality and further reduce the color unevenness by the features described later.

The light emitting device of Embodiment 1 will be explained in detail below.

Figure 3:
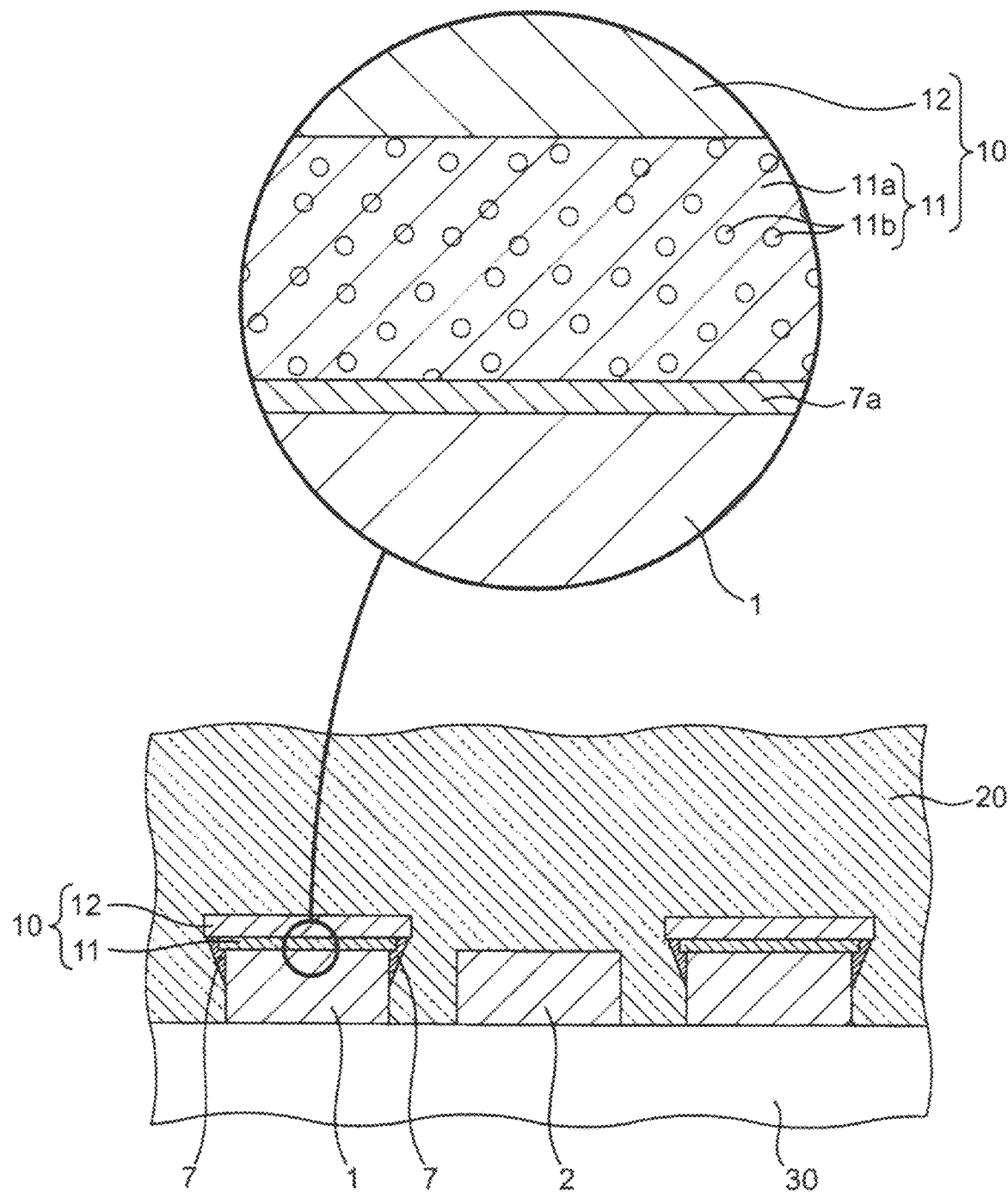
FIG. 3 includes cross sections enlarging certain portions of the cross section in FIG. 2.

First, as shown in FIG. 3, the wavelength conversion members 10 each have a light transmitting part 12 made of an inorganic material having an upper face and a lower face, and a phosphor layer 11 disposed on the lower face of the light transmitting part 12 where the phosphor layer 11 is disposed on each first light emitting element 1 so as to oppose the emission face of the first light emitting element 1. The phosphor layer 11 includes, for example, a light transmissive resin 11a and first phosphor particles 11b dispersed in the light transmissive resin 11a. The first phosphor particles 11b are excited by first light emitted by the first light emitting elements 1, and emit light having a different wavelength from that of the first light.

For example, the phosphor layer 11 is disposed such that the outline of the phosphor layer 11 is positioned inside the outline of the lower face of the light transmitting part 12, and is given a shape that is substantially the same as that of the emission face of the light emitting element 1. Forming the phosphor layer 11 inside the outline of the lower face of the light transmitting part 12 in this manner can facilitate the formation of a reflecting member 7 that covers the lateral faces of the phosphor layer 11. Such a phosphor layer 11 can be produced, for example, by the method described below.

Figure 6A:
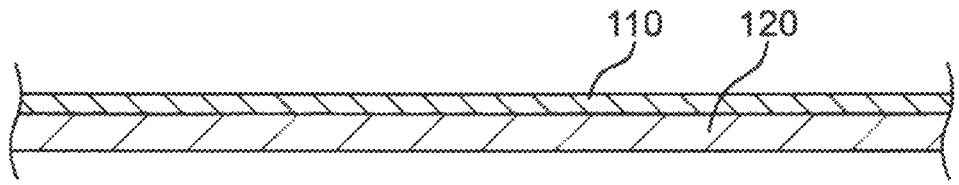
FIG. 6A is a cross section showing a manufacturing process for the wavelength conversion member used in one form of the light emitting device of Embodiment 1.

First, a light transmitting part 120 made up of a plurality of light transmitting parts 12, is prepared, and as shown in FIG. 6A, a phosphor layer 110 is formed on substantially the entire surface of one of the principal faces thereof. The phosphor layer 110 can be formed, for example, by printing, compression molding, phosphor electrodeposition, phosphor sheet method, transfer molding, or the like.

Then the phosphor layer 110 is separated into individual pieces of phosphor layer 11 on the light transmitting part 120.

Figure 6B:
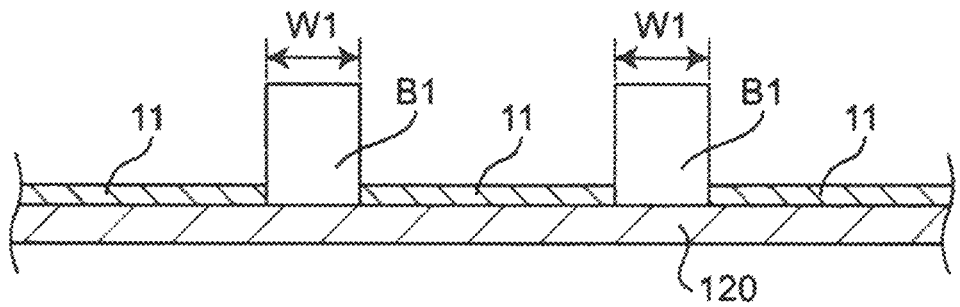
FIG. 6B is a cross section showing a manufacturing process for the wavelength conversion member used in the form of the light emitting device of Embodiment 1.
Figure 6C:
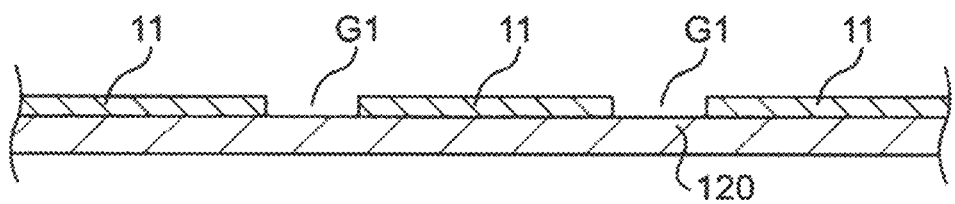
FIG. 6C is a cross section showing a manufacturing process for the wavelength conversion member used in the form of the light emitting device of Embodiment 1.

By using a blade B1 having a prescribed width W1, as shown in FIG. 6B, grooves G1 having the width W1 are created in the phosphor layer 110 in vertical and horizontal directions to thereby separate the phosphor layer 110 into individual pieces of phosphor layer 11 (FIG. 6C).

Figure 6D:
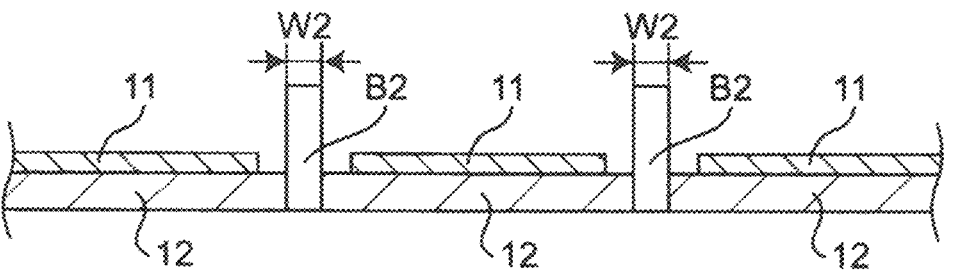
FIG. 6D is a cross section showing a manufacturing process for the wavelength conversion member used in the form of the light emitting device of Embodiment 1.
Figure 6E:
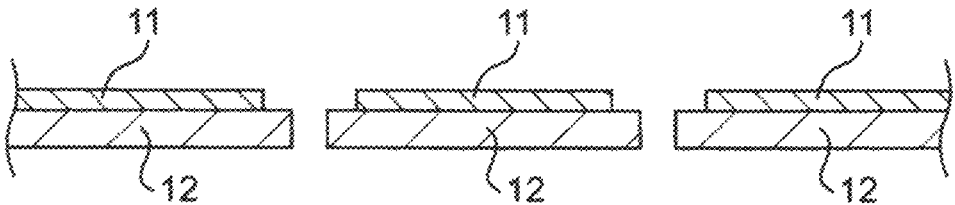
FIG. 6E is a cross section showing a manufacturing process for the wavelength conversion member used in the form of the light emitting device of Embodiment 1.

Then as shown in FIG. 6D, by using a blade B2 having a narrower width W2 than that of the blade B1, grooves G2 are created in the light transmitting part 120 in the grooves G1 to thereby divide the light transmitting part 120 into a plurality of light transmitting parts 12 (FIG. 6E). The blade B2 is moved while aligning the center lines of the grooves G1 with the center lines of the grooves G2.

In the manner described above, each phosphor layer 11 whose outline is positioned inside the outline of the lower face of each light transmitting part 12 is prepared.

Figure 4:
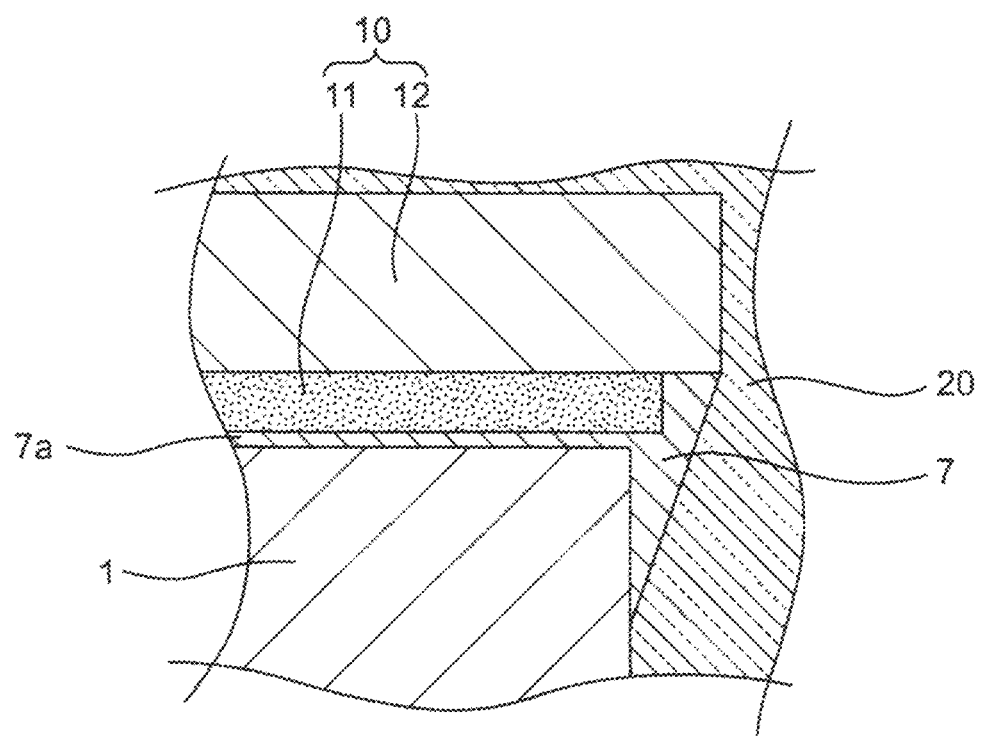
FIG. 4 is a cross section enlarging a portion of the cross section in FIG. 3 in relation to a form of the light emitting device of Embodiment 1.
Figure 5:
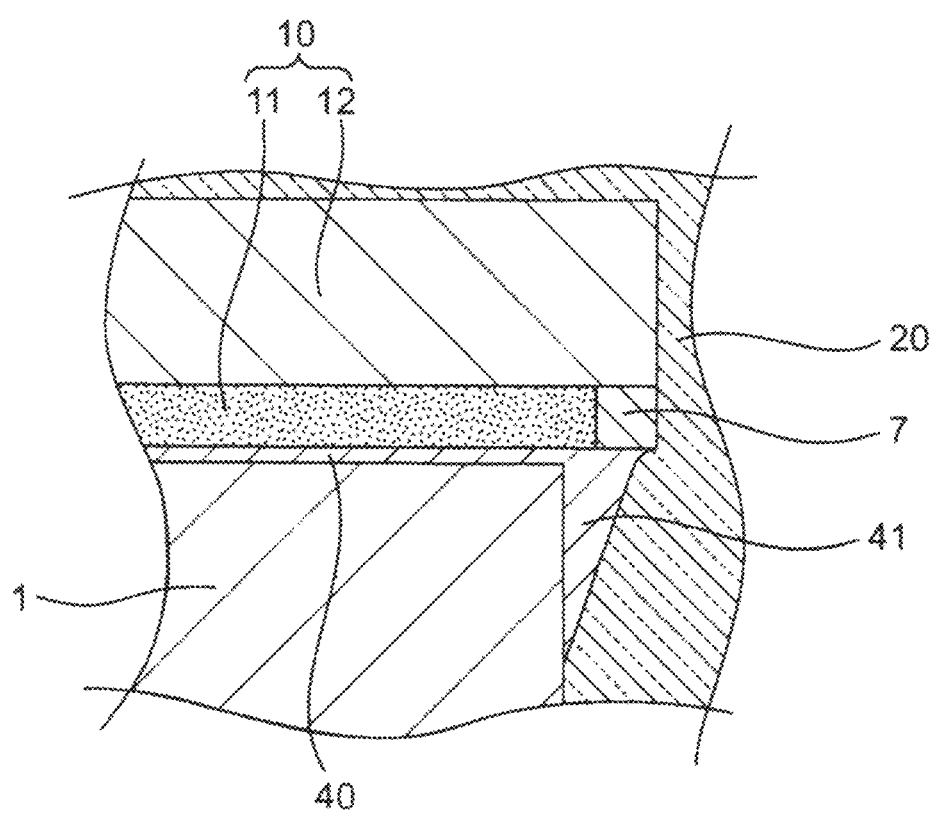
FIG. 5 is a cross section enlarging a portion of the cross section in FIG. 3 in relation to another form of the light emitting device of Embodiment 1.

As shown in FIG. 3 to FIG. 5, the reflecting member 7 is disposed to cover the lateral faces of the phosphor layer 11 to restrain the light emitted by the second light emitting elements 2 from entering the lateral faces of the phosphor layer 11. The reflecting member 7 can be formed by bonding the phosphor layer 11 of the wavelength conversion members 10 and the first light emitting elements 1 together by using, for example, a reflecting bonding resin which has both a bonding function and a reflecting function. Specifically, the reflecting member can be formed, for example, by pressing the wavelength conversion members 10 from above when bonding the phosphor layer 11 and the first light emitting elements 1, which allows the reflecting bonding resin applied to the surface of the phosphor layer 11 and/or the emission faces of the first light emitting elements 1 to squeeze out, wet and spread. This can, as shown in FIG. 3 and FIG. 4, form a reflecting member 7 that continuously covers the lateral faces of the phosphor layer 11 and at least the upper portions of the lateral faces of the first light emitting elements 1 near the phosphor layer 11. This can more effectively restrain the emitted light from the second light emitting elements 2 from entering the phosphor layer 11 while restraining the light from leaking from the lateral faces of the first light emitting elements 1. In the case of forming a reflecting member 7 using a reflecting bonding resin having both a bonding function and a reflecting function as described above, the cross-sectional shape of the reflecting member 7, for example, is substantially triangular with the thickness becoming smaller as the distance from the phosphor layer 11 increases. That is, because the reflecting member 7 is relatively thicker near the phosphor layer 11, it can effectively restrain the emitted light from the second light emitting elements 2 from entering the phosphor layer 11. This reflecting bonding resin, for example, is a bonding resin containing an inorganic filler such as titanium oxide. In this case, in order to minimize the attenuation of the light entering the phosphor layer 11 from the first light emitting elements 1, the bonding layer (reflecting bonding layer) 7a located between the phosphor layer 11 and the first light emitting elements 1 is preferably formed thinly to the extent possible while ensuring the bonding strength. The thickness of the reflecting member 7 located between the upper face of a first light emitting element 1 and the phosphor layer 11 can be set, for example, to about 3 μm to about 8 μm.

Moreover, the reflectance of the reflecting member 7 can be adjusted by varying the concentration of the filler contained therein.

For example, for the reflecting member 7 disposed on the lateral faces of the phosphor layer 11, one having a reflectance relative to the light from the light emitting element of about 90% to about 98% can be used. The concentration of the inorganic filler in the reflecting member 7 can be set to about 2 mass percent to about 6 mass percent.

Furthermore, the light transmissive sealing resin 20, for example, is made of a resin having light transmissivity, and may further contain phosphor particles as in the case of Embodiment 3 described later.

In the above, an example has been explained where a reflecting member 7 is formed by bonding the phosphor layer 11 of the wavelength conversion members 10 and the first light emitting elements 1 by using a reflecting bonding resin having both a bonding function and a reflecting function.

In the light emitting device of Embodiment 1, however, the reflecting member 7 may alternatively be formed in the manner described below.

Figure 7A:
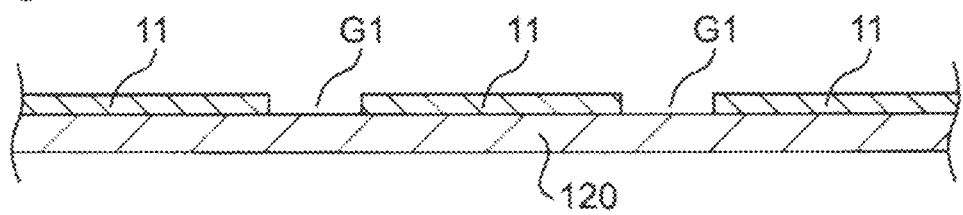
FIG. 7A is a cross section showing a manufacturing process for the wavelength conversion member used in another form of the light emitting device of Embodiment 1.
Figure 7B:
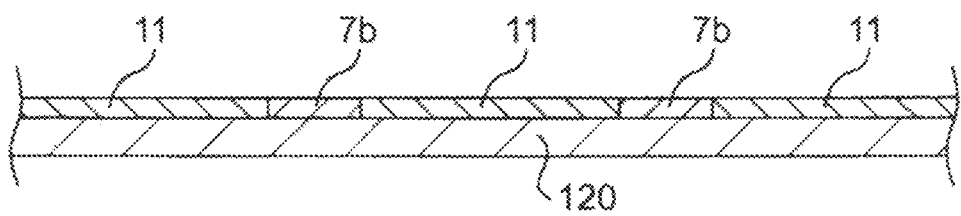
FIG. 7B is a cross section showing a manufacturing process for the wavelength conversion member used in the form of the light emitting device of Embodiment 1.
Figure 7C:
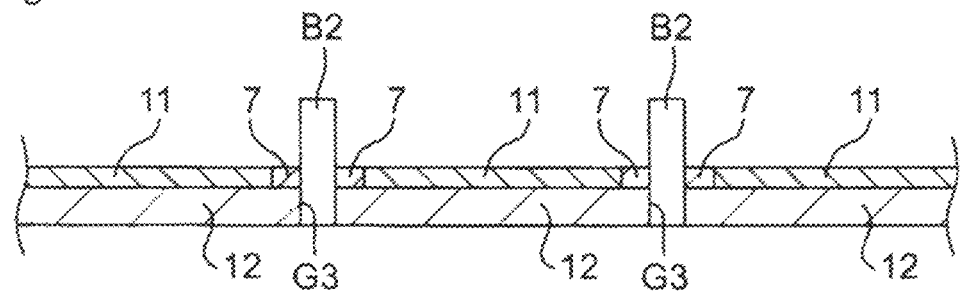
FIG. 7C is a cross section showing a manufacturing process for the wavelength conversion member used in the form of the light emitting device of Embodiment 1.
Figure 7D:
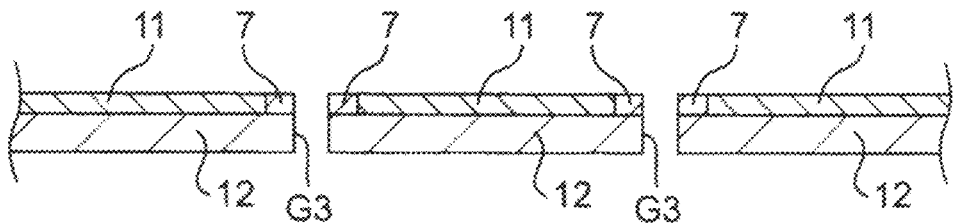
FIG. 7D is a cross section showing a manufacturing process for the wavelength conversion member used in the form of the light emitting device of Embodiment 1.

First, using a method similar to that explained with reference to FIG. 6A to FIG. 6C, a phosphor layer 110 is formed on substantially the entire surface of one principal face of the light transmitting part 120. Then by using a blade B1 having a width W1, grooves G1 having the width W1 are formed in the phosphor layer 110 in vertical and horizontal directions (FIG. 7A). Then as shown in FIG. 7B, the grooves G1 are filled with a reflecting material (denoted as 7b in the figure), and as shown in FIG. 7C, by using a blade B2 having a narrower width W2 than that of the blade B1, grooves G3 are formed in the reflecting members 7b and the light transmitting part 120 in the grooves G1 to thereby separate the light transmitting part 120. In this manner, wavelength conversion members 10 in which the lateral faces of the phosphor layer 11 are covered with a reflecting member 7 can be prepared. By bonding each of the wavelength conversion members 10 having a reflecting member 7 covering the lateral faces of the phosphor layer 11 as described above onto each first light emitting element 1, the light emitting device of Embodiment 1 shown in FIG. 5 in which the lateral faces of the phosphor layer 11 are covered by the reflecting member 7 can be produced.

In the case of the light emitting device shown in FIG. 5, the wavelength conversion members 10 and the first light emitting elements 1 are bonded by bonding members 40, and in this case, the bonding members 40 preferably have fillets 41 that cover at least some portions of the lateral faces of the first light emitting elements 1, and the fillets 41 preferably contain a light reflecting filler. By containing a light reflecting filler, the fillets 41 can reflect the emitted light from the second light emitting elements 2 to thereby restrain the light from entering the phosphor layer 11.

In the case of the light emitting device of Embodiment 1 constructed in this manner, first emission parts which include the first light emitting elements 1 and the first phosphor particles 11b are formed and second emission parts which include the second light emitting elements 2 are formed.

In the light emitting device of Embodiment 1 described above, the light from the first emission parts, which include the first light emitting elements 1, and the light from the second emission parts, which include the second light emitting elements 2, are mixed (color mixing) to be output from the upper face of the light transmissive sealing resin 20 as light having a desired emission color. In other words, the light emitting device of Embodiment 1 allows the first light emitted by the first light emitting elements 1, the second light emitted by the second light emitting elements 2, and the light emitted by the first phosphor particles 11b to be mixed in the light transmissive sealing resin 20 that collectively covers the second light emitting elements 2, the first light emitting elements 1, and the wavelength conversion members 10 before being output from the upper face of the light transmissive sealing resin 20 as light having a desired emission color.

In the light emitting device of Embodiment 1, the base 30 has first wiring 31 for supplying power to the first light emitting elements 1 and second wiring 32 for supplying power to the second light emitting elements 2. This allows the supply of power to the first light emitting elements 1 and the supply of power to the second light emitting elements 2 to be independently controlled. By allowing the first emission parts and the second emission parts to have different emission colors, and controlling the current values applied to the first wiring 31 and the second wiring 32, the emission color of the light emitting device can be varied. This will be explained in detail later.

In the light emitting device of Embodiment 1 described above, the wavelength conversion members 10 are each provided with a light transmitting part 12 made of an inorganic material, and the light transmissive sealing resin 20 is formed to cover the wavelength conversion members 10 which include the light transmitting parts 12. This makes the interfaces between the inorganic material and the resin, i.e., the lateral faces of the light transmitting parts 12, light scattering surfaces, thereby facilitating color mixing within the light transmissive sealing resin 20 and effectively reducing the unevenness in the color of light being output from the upper face of the light transmissive sealing resin 20.

For example, the refractive indices of inorganic materials generally vary greatly depending on the type as compared to resins, making available a large selection of materials having various refractive indices for the light transmitting parts 12. This can increase the refractive index difference between the inorganic material employed for the light transmitting parts 12 and the light transmissive sealing resin 20 to thereby increase the reflectance of the lateral faces of the light transmitting parts 12. The wavelength conversion members 10 are usually prepared by forming a large-sized phosphor layer on a principal surface of the light transmitting part before being cut into individual wavelength conversion members 10. This makes the cut surfaces, i.e., the lateral faces, of the wavelength conversion members 10 rough surfaces having high scattering power.

Accordingly, the light emitting device of Embodiment 1 having the wavelength conversion members 10 that include light transmitting parts 12 made of an inorganic material, and the light transmissive sealing resin 20 formed to cover the wavelength conversion members 10 that include the light transmitting parts 12 is capable of further improving color mixing occurring within the light transmissive sealing resin 20 and further reducing the unevenness in the color of light being output from the upper face of the light transmissive sealing resin 20.

In the light emitting device of Embodiment 1, moreover, the refractive index of the light transmitting parts 12 is preferably higher than that of the light transmissive sealing resin 20. This makes the refraction angle of the light being output from the upper face of a light transmitting part 12 larger than the angle of incidence in the light transmitting part 12 thereby allowing the first light passing through the light transmitting part 12 and the light emitted by the first phosphor particles 11b to diverge when being output from the upper face of each light transmitting part 12 (the face opposing the face where the phosphor layer 11 is formed), further improving the color mixing quality.

The circuit configuration of the light emitting device of Embodiment 1 will be explained next.

As described above, the upper face of the base 30 has first wiring 31 for supplying power to the first light emitting elements 1 and second wiring 32 for supplying power to the second light emitting elements 2.

Figure 8:
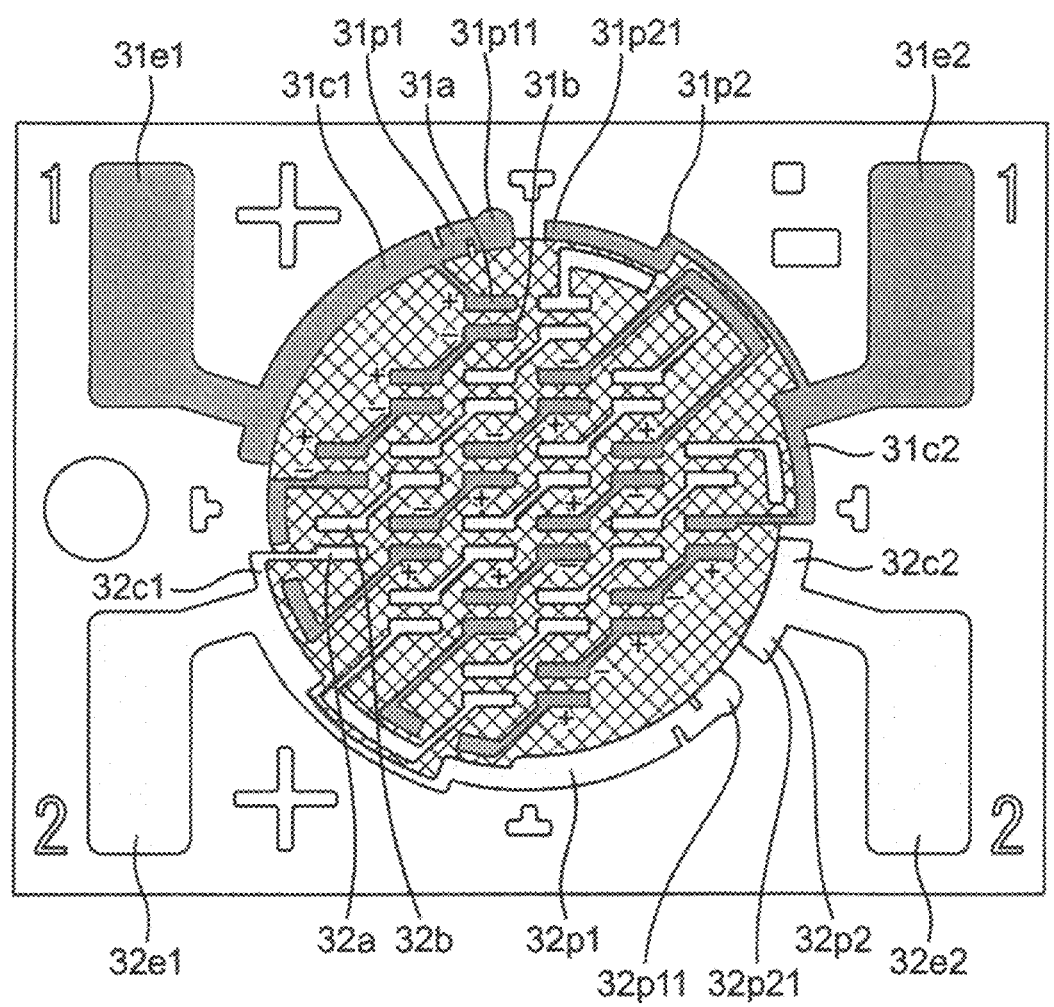
FIG. 8 is a top view of a base 30.

As shown in FIG. 8, the first wiring 31 has, in the mounting area inside the frame 33, for each first light emitting element 1 mounted, a first p-side land 31a connected to the p-side electrode of the first light emitting element 1 and a first n-side land 31b connected to the n-side electrode of the first light emitting element 1. The parts of the first wiring 31 located in the mounting area are collectively referred to as first internal wiring. The first wiring 31 also has, on the outside of the frame 33, a positive side first external connection land 31e1 and a negative side first external connection land 31e2. Furthermore, the first wiring 31 has a first connection wiring part 31c1 connecting the first external connection land 31e1 and the beginning land of the first internal wiring, and a first connection wiring part 31c2 connecting the first external connection land 31e2 and the ending land of the first internal wiring. In the first internal wiring, as shown in FIG. 8, the first n-side lands 31b and the first p-side lands 31a, except for the first p-side land 31a directly connected to the first connection wiring part 31c1 and the first n-side land 31b directly connected to the first connection wiring part 31c2, are connected using wiring parts or wires formed on the upper face of the base such that the plurality of first light emitting elements 1 are connected in series between the first external connection land 31e1 and the first external connection land 31e2 when the first light emitting elements 1 are connected. The first wiring 31 also has a first protective device connection wiring part 31p1 extending from the first connection wiring part 31c1 on the opposite side of the first external connection land 31e1 relative to the part connected to the beginning land of the first internal wiring, and a first protective device connection wiring part 31p2 extending from the first connection wiring part 31c2 on the opposite side of the part connected to the ending land of the first internal wiring relative to the first external connection land 31e2. The tips of the first protective device connection wiring parts 31p1 and 31p2 are referred to as first protective device mounting parts 31p11 and 31p21, respectively.

The second wiring 32 has, in the mounting area inside the frame 33, for each second light emitting element 2, a second p-side land 32a connected to the p-side electrode of the second light emitting element 2 and a second n-side land 32b connected to the n-side electrode of the second light emitting element 2. The parts of the second wiring 32 located in the mounting area are collectively referred to as second internal wiring. The second wiring 32 has, on the outside of the frame 33, a positive side second external connection land 32e1 and a negative side second external connection land 32e2. The second wiring 32 has a second connection wiring part 32c1 connecting the second external connection land 32e1 and the beginning land of the second internal wiring, and a second connection wiring part 32c2 connecting the second external connection land 32e2 and the ending land of the second internal wiring. In the second internal wiring, as shown in FIG. 8, the second n-side lands 32b and the second p-side lands 32a, except for the second p-side land 32a directly connected to the second connection wiring part 32c1 and the n-side land 32b directly connected to the second connection wiring part 32c2, are connected using wiring parts or wires formed on the upper face of the base such that the plurality of second light emitting elements 2 are connected in series between the second external connection land 32e1 and the second external connection land 32e2 when the second light emitting elements 2 are connected. Furthermore, the second wiring 32 has a second protective device connection wiring part 32p1 extending from the second connection wiring part 32c1 on the opposite side of the part connecting the second connection wiring part 32c1 and the beginning land of the second internal wiring relative to the second external connection land 32e1, and a second protective device connection wiring part 32p2 extending on the opposite side of the part connecting the second external connection wiring part 32c2 and the ending land of the second internal wiring relative to the second external connection land 32e2. The tips of the second protective device connection wiring parts 32p1 and 32p2 are referred to as second protective device mounting parts 32p11 and 32p21, respectively.

Figure 9:
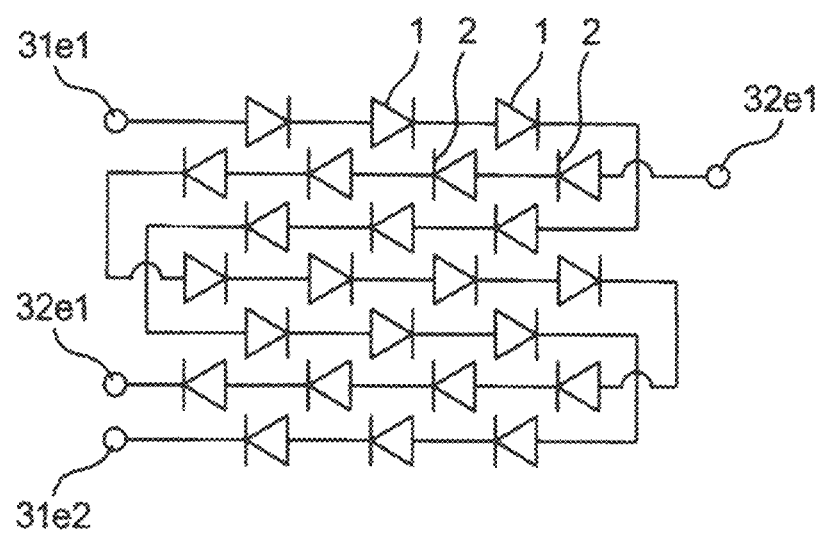
FIG. 9 is a diagram showing the circuit configured for the first light emitting element and the second light emitting element in a light emitting device of Embodiment 1.

By individually connecting the first light emitting elements 1 to the first p-side lands 31a and the first n-side lands 31b of the first wiring 31 disposed as above, the plurality of first light emitting elements 1 can be serially connected between the first external connection land 31e1 and the first external connection land 31e2 as shown in FIG. 9.

By mounting a protective device on the first protective device mounting part 31p11 as needed, and connecting the cathode of the protective device to the first protective device mounting part 31p11 while connecting the anode of the protective device to the first protective device connection wiring part 31p2, the protective device can be parallelly connected to the first serial circuit where the first light emitting elements 1 are serially connected.

By individually connecting the second light emitting elements 2 to the second p-side lands 32a and the second n-side lands 32b of the second wiring 32, the plurality of second light emitting elements 2 can be serially connected between the second external connection land 32e1 and the second external connection land 32e2 as shown in FIG. 9.

By mounting a protective device on the second protective device mounting part 32p11 as needed, and connecting the cathode of the protective device to the second protective device mounting part 32p11 while connecting the anode of the protective device to the second protective device connection wiring part 32p2, the protective device can be parallelly connected to the second serial circuit where the second light emitting elements 2 are serially connected.

By independently controlling the current values for the first serial circuit serially connecting the first light emitting elements 1 and the second serial circuit serially connecting the second light emitting elements 2, the emission color of the light emitting device as a whole can be changed (color creation).

In the above, an example of a light emitting device of Embodiment 1 where all first light emitting elements 1 are serially connected between the first external connection land 31e1 and the first external connection land 31e2 and all second light emitting elements 2 are serially connected between the second external connection land 32e1 and the second external connection land 32e2 has been explained. The light emitting device of Embodiment 1, however, is not limited to this. For example, the first light emitting elements 1 and the second light emitting elements 2 may respectively be divided into groups where the first light emitting elements 1 and the second light emitting elements 2 are connected in series in each group, and the respective serial circuits are parallelly connected between the first external connection land 31e1 and the first external connection land 31e2 and between the second external connection land 32e1 and the second external connection land 32e2.

Embodiment 2

The light emitting device of Embodiment 2 differs from the light emitting device of Embodiment 1 such that (a) the shape of the frame 53 when viewed from above is an octagon, and (b) the shapes of some portions of the first wiring and the second wiring are modified in accordance with the octagonally shaped frame 53. The light emitting device of Embodiment 2 is constructed in a similar manner to the light emitting device of Embodiment 1 except for the differences (a) and (b) described above.

The differences between the light emitting devices of Embodiments 1 and 2 will be specifically explained below while omitting the descriptions of similar features.

Figure 10:
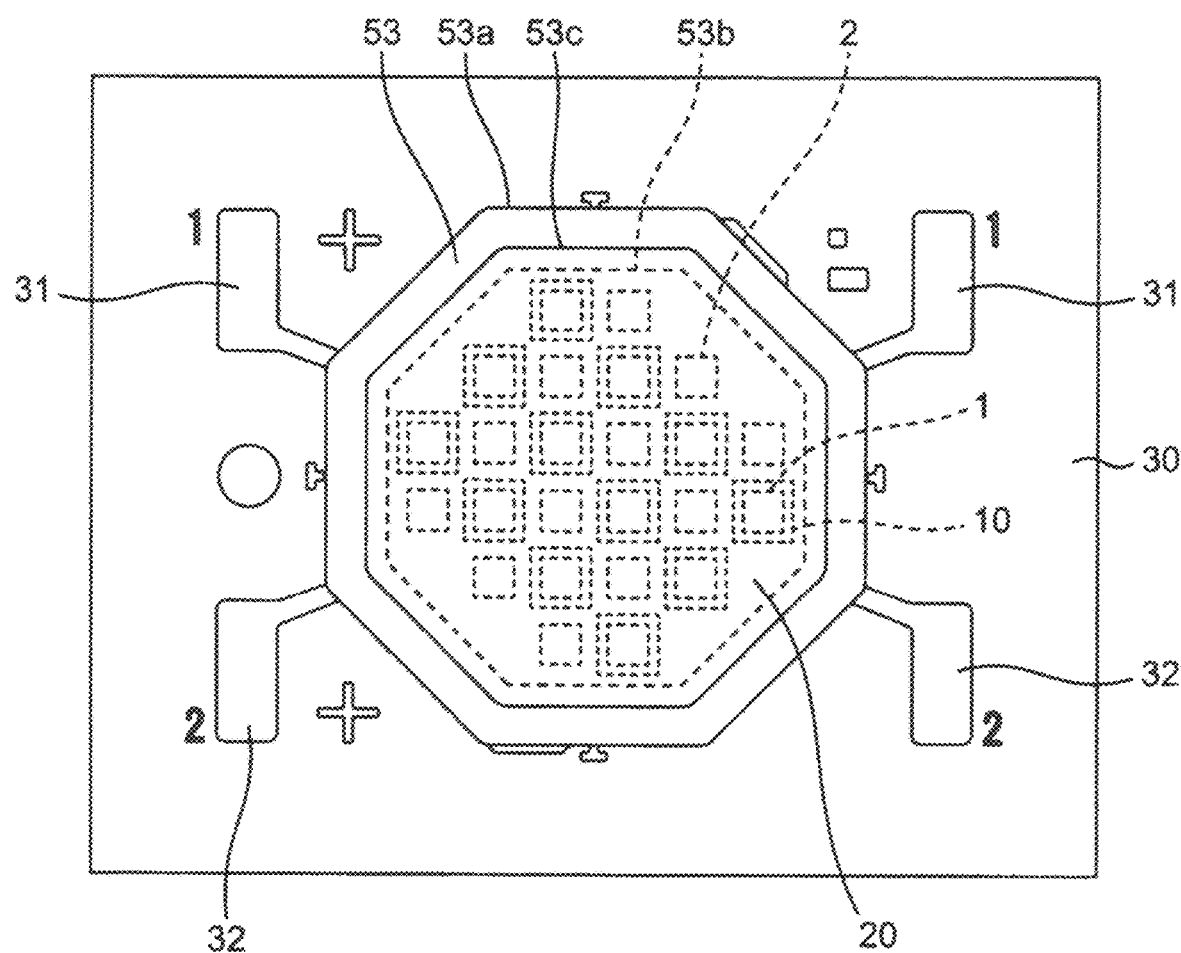
FIG. 10 is a top view of a light emitting device according to Embodiment 2.

As stated above, in the light emitting device of Embodiment 2, the frame 53 has an octagonal shape when viewed from above as shown in FIG. 10. That is, the shape of the outer peripheral lower edge 53a and the shape of the inner peripheral lower edge 53b on the upper face of the base 30 are octagonal, and the boundary with the light transmissive sealing resin 20 at the surface of the frame 53 is also octagonal. In the light emitting device of Embodiment 2, the surface of the light transmissive sealing resin 20 inside the boundary 53c becomes the emission face of the light emitting device.

Figure 11:
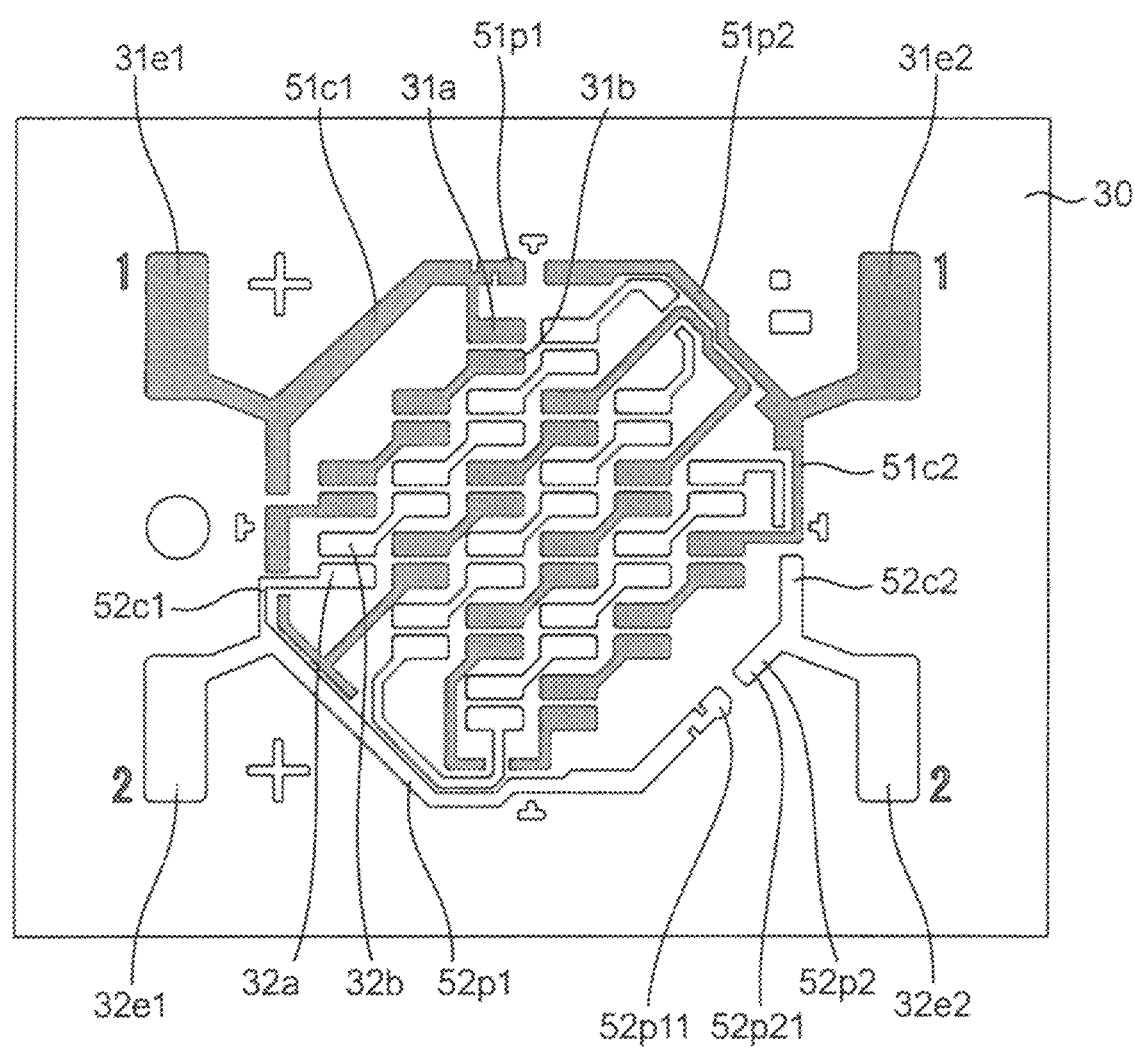
FIG. 11 is a top view of a base 60.

In accordance with the octagonally shaped frame 53, the shapes of portions of the first wiring and the second wiring, i.e., shapes of some portions of the first wiring and the second wiring embedded in the frame 53, differ from those of the light emitting device of Embodiment 1. Specifically, as shown in FIG. 11, the first connection wiring parts 51c1, 51c2, the first protective device connection wiring parts 51p1, 51p2, the second connection wiring parts 52c1, 52c2, the second protective device connection wiring parts 52p1 and 52p2 are disposed between and in parallel with the outer peripheral lower edge 53a and the inner peripheral lower edge 53b of the frame 53. The first connection wiring parts 51c1, 51c2, the first protective device connection wiring parts 51p1, 51p2, the second connection wiring parts 52c1, 52c2, the second protective device connection wiring parts 52p1 and 52p2 embedded in the frame 53 are disposed while being bent as needed at the corners of the octagonal frame 53.

The light emitting device of Embodiment 2 constructed as above can reduce the spacing between the inner peripheral lower edge 53b and the first light emitting elements 1 together with the wavelength conversion members 10 disposed along the inner peripheral lower edge 53b of the frame 53, as well as the spacing between the inner peripheral lower edge 53b and the second light emitting elements 2 disposed along the inner peripheral lower edge 53b of the frame 53. In the case of a light emitting device of Embodiment 1, because the frame 33 is circular, disposing the light emitting elements such that their centers coincide with the lattice points of the quadrilateral lattice while ensuring certain spacing between the inner peripheral lower edge of the frame 33 and all of the light emitting elements that are located along the outer perimeter results in large spacing between some of the light emitting elements and the inner peripheral lower edge. In contrast, in the case of a light emitting device of Embodiment 2, because the frame 53 is octagonal, disposing the light emitting elements such that their centers coincide with the lattice points of the quadrilateral lattice can easily achieve the same spacing between the inner peripheral lower edge 53b and all of the light emitting elements that are located along the outer perimeter. It does not result in large spacing between the inner peripheral lower edge 53b and some of the light emitting elements. The light emitting device of Embodiment 2 can thus reduce the size of the emission face of the light emitting device as compared to the light emitting device of Embodiment 1.

Since the size of the device's emission face can be reduced as described above, the light emitting device of Embodiment 2 can have a higher luminous flux density than others when the same type and number of light emitting elements are used. For example, in a lighting device such as a lamp constructed with the light emitting device of Embodiment 2, the light from the light emitting device can be efficiently utilized, i.e., the light can be more efficiently captured.

Being capable of increasing the luminous flux density, the light emitting device of Embodiment 2 can, for example, increase the light collection efficiency of a lamp that employs the light emitting device of Embodiment 2.

As described above, the light emitting device of Embodiment 2 can achieve the same spacing between the inner peripheral lower edge 53b and the light emitting elements disposed along the inner peripheral lower edge 53b. Accordingly, it can reduce color unevenness in the peripheral portion of the emission face that might otherwise result from large spacing between some of the light emitting elements and the inner peripheral lower edge 53b. Accordingly, the light emitting device of Embodiment 2 can more effectively reduce color unevenness.

In FIG. 10 which relates to a light emitting device of Embodiment 2, the top view shape of the frame 53 is drawn as a regular octagon, however, the top view shape of the frame 53 in the light emitting device of Embodiment 2 is not limited to a regular octagon. Considering the layout of the light emitting elements, for example, the top view shape of the frame 53 may be an octagon where the lengths of the sides oblique to the rows or columns at a 45 degree angle are larger than the lengths of the sides paralleling the rows or columns such that the spacing between the light emitting elements and the inner peripheral lower edge 53b is more uniform.

Embodiment 3

Figure 12:
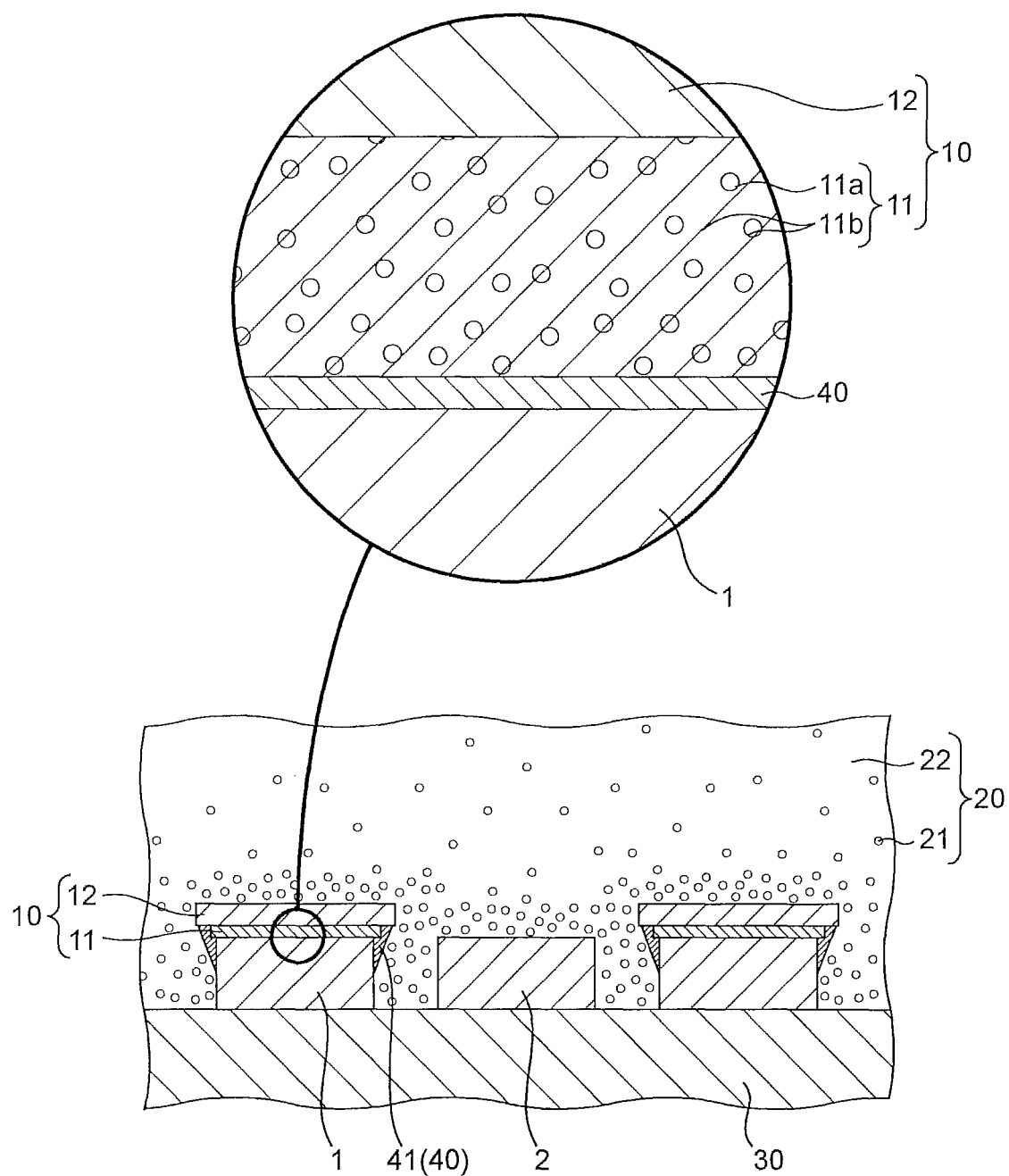
FIG. 12 includes cross sections enlarging certain portions of the cross section of a light emitting device according to Embodiment 3.

The light emitting device of Embodiment 3, as shown in FIG. 12, is constructed in a similar manner to the light emitting device of Embodiment 1 except that the light transmissive sealing resin 20 contains second phosphor particles 21. In the light emitting device of Embodiment 3, the light transmissive sealing resin 20 includes a sealing resin 22 and second phosphor particles 21. The second phosphor particles 21 are excited by the second light emitted by the second light emitting elements 2 and emit light having a different wavelength from that of the light emitted by the second light emitting elements 2. Alternatively, the second phosphor particles 21 may be excited by the first light emitted by the first light emitting elements 1 and emit light having a different wavelength from those of the first light and the second light.

In the light emitting device of Embodiment 3 described above, first emission parts are formed with the first light emitting elements 1, the first phosphor particles 11b, and, if the second phosphor particles 21 are excited by the first light, the second phosphor particles 21, and second emission parts are formed with the second light emitting elements 2 and the second phosphor particles 21.

In the light emitting device of Embodiment 3 constructed as above, the light from the first emission parts which include the first light emitting elements 1 and the light from the second emission parts which include the second light emitting elements 2 are mixed, i.e., mixing colors, and light having a desired emission color is output from the upper face of the light transmissive sealing resin 20. In other words, the light emitting device of Embodiment 3 allows the first light emitted by the first light emitting elements 1, the second light emitted by the second light emitting elements 2, the light emitted by the first phosphor particles 11b, and the light emitted by the second phosphor particles 21 to be mixed in the light transmissive sealing resin 20 that collectively covers the second light emitting elements 2, the first light emitting elements 1, and the wavelength conversion members 10 before being output from the upper face of the light transmissive sealing resin 20 as light having a desired emission color.

The light emitting device of Embodiment 3 has first wiring 31 for supplying power to the first light emitting elements 1 and second wiring 32 for supplying power to the second light emitting elements 2 in a similar manner to in Embodiment 1, and further includes second phosphor particles 21 contained in the light transmissive sealing resin 20. This allows for more fine-tuned changes in the emission color of the light emitting device achieved by controlling the current values for the first wiring 31 and the second wiring 32.

In the light emitting device of Embodiment 3, furthermore, the second phosphor particles 21 are preferably localized in the sealing resin 22 such that the density is higher near the first light emitting elements 1 and the second light emitting elements 2. For example, allowing the second phosphor particles 21 to settle and localize in the sealing resin 22 such that the density is higher near the first light emitting elements 1 and the second light emitting elements 2 in the manufacturing process can make the thickness of the portion where the second phosphor particles 21 are localized substantially uniform. This makes the optical path lengths uniform for the light passing through the portion where the density of the second phosphor particles 21 is high, and can reduce color unevenness and restrain any yellow ring from occurring.

The first phosphor particles 11b contained in the phosphor layer 11 and the second phosphor particles 21 contained in the light transmissive sealing resin 20 preferably include two or more types of phosphors having different emission colors. A desired emission color can easily be achieved by appropriately selecting two or more types of phosphor particles having different emission colors for the first phosphor particles 11b to be contained in the phosphor layer 11, appropriately setting the content of each phosphor type, appropriately selecting two or more types of phosphor particles having different emission colors for the second phosphor particles 21 to be contained in the light transmissive sealing resin 20, and appropriately setting the content of each phosphor type. For example, allowing the phosphor layer 11 to contain first red emitting phosphor particles and first green emitting phosphor particles while allowing the light transmissive sealing resin 20 to contain second red emitting phosphor particles and second green emitting phosphor particles can easily achieve a desired emission color along the black body locus.

In this case, the first red emitting phosphor particles and the second red emitting phosphor particles may be the same or different phosphor materials. The first green emitting phosphor particles and the second green emitting phosphor particles may be the same or different phosphor materials. Employing the same materials for the first red emitting phosphor particles and the second red emitting phosphor particles, and the same material for the first green emitting phosphor particles and the second green emitting phosphor particles, for example, can reduce any change in the color rendering characteristics even when the emission color of the light emitting device is changed by controlling the current values for the first wiring 31 and the second wiring 32.

We will now consider a light emitting device of Embodiment 3 which, for example, includes blue light emitting elements for both the first light emitting elements 1 and the second light emitting elements 2, and the phosphor layer 11 and the light transmissive sealing resin 20 each containing the same red emitting and green emitting phosphor particles excitable by blue light. In this light emitting device, the emission color of the first emission parts that include the first light emitting elements 1 would have a low color temperature because the red emitting phosphor particles and the green emitting phosphor particles contained in the phosphor layer 11, and the red emitting phosphor particles and the green emitting phosphor particles contained in the light transmissive sealing resin 20 are present above the first light emitting elements 1. In contrast, the emission color of the second emission parts that include the second light emitting elements 2 would have a high color temperature because only the red emitting phosphor particles and the green emitting phosphor particles contained in the light transmissive sealing resin 20 are essentially present above the second light emitting elements 2. Accordingly, in this example, applying a higher current value to the first serial circuit in which the first light emitting elements 1 are serially connected than the current value applied to the second serial circuit in which the second light emitting elements 2 are serially connected allows the light emitting device to emit light of a low color temperature, and applying a lower current value to the first serial circuit than the current value applied to the second serial circuit allows the light emitting device to emit light of a high color temperature. Changing both current values for the first serial circuit and the second serial circuit without changing the ratio can change the intensity of light without allowing the emission color to change.

In accordance with the light emitting device of Embodiment 3, moreover, employing blue light emitting elements for both the first light emitting elements 1 and the second light emitting elements 2 and having both the phosphor layer 11 and the light transmissive resin 20 contain the same red emitting and green emitting phosphor particles excitable by blue light, for example, allows the first emission parts which include the first light emitting elements 1 to have a color temperature of about 2700K, and the second emission parts which include the second light emitting elements 2 to have a color temperature of about 6500K. In accordance with the light emitting device of Embodiment 3, a light emitting device can be provided which can change the color temperature of the emission color from 2700K to 6500K.

In the case of bonding the wavelength conversion members 10 and the first light emitting elements 1 using bonding members 40 in the light emitting device of Embodiment 3, the bonding members 40 preferably include fillets 41 that cover at least some portions of the lateral faces of the first light emitting elements 1, and the fillets 41 preferably contain a light reflecting filler. Having the fillets 41 contain a reflecting filler allows the light output from the lateral faces of the second light emitting elements 2 to be reflected by the fillets 41 and utilized as light that excites the second phosphor particles 21, thereby increasing the wavelength conversion efficiency. When the bonding members 40 include fillets 41 containing a light reflecting filler, light can be reflected and scattered by the filets 41 to thereby further improve the color mixing quality.

Embodiment 4

Figure 13:
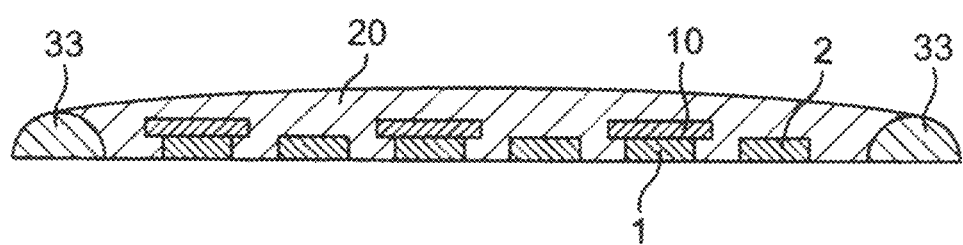
FIG. 13 is a cross-sectional view of a light emitting device according to Embodiment 4.

The light emitting device of Embodiment 4, as shown in FIG. 13, differs from the light emitting device of Embodiment 1 by not including a base 30. The light emitting device of Embodiment 4 is constructed in a similar manner to the light emitting device of Embodiment 1 except for the exclusion of the base 30.

In the light emitting device of Embodiment 4, the first light emitting elements 1, the second light emitting elements 2, the wavelength conversion members 10 and the like are supported by the light transmissive sealing resin 20.

The light emitting device of Embodiment 4 can be used, for example, by being mounted on a circuit board having a control circuit or the like to control the emission of the light emitting device. In the light emitting device of Embodiment 4, the external connection electrodes can be used, for example, by exposing the p-side electrodes and the n-side electrodes of the first light emitting elements 1 and the second light emitting elements 2 at the lower face of the light emitting device and connecting the light emitting elements using the wiring formed on the circuit board. Alternatively, first wiring and second wiring similar to those shown in Embodiment 1 may be formed on the lower face of the light emitting device (the lower face of the light transmissive sealing resin 20).

The light emitting device of Embodiment 4 can be manufactured in a similar manner to that in Embodiment 1 by using a support substrate which is subsequently removed. In the case of forming first wiring and second wiring on the lower face of the light emitting device in a similar manner to in Embodiment 1, a support substrate having first wiring and second wiring disposed thereon in a transferrable manner can be used in the process, and at the time of subsequently removing the support substrate, it is removed in such a way that the first wiring and the second wiring remain on the light emitting device.

The light emitting device of Embodiment 4 constructed as above can be utilized for various purposes as it allows a user to design wiring in accordance with the purpose.

The constituent elements of the embodiments and the materials used for the constituent elements will be explained next.

First Phosphor Particles and Second Phosphor Particles

The first phosphor particles and the second phosphor particles (hereinafter simply referred to as phosphor particles) are phosphor materials that are excited by at least a portion of the light emitted by a light emitting element and emit light having a different wavelength from the emission wavelength of the light emitting element.

For example, in the case of employing blue light emitting elements for the first light emitting elements 1 and the second light emitting elements 2, using a yellow emitting phosphor material excitable by blue light and emitting yellow light, and a red emitting phosphor material which is excitable by blue light and emitting red light for the phosphor particles allows the device to emit white light.

For specific phosphor materials for blue emitting phosphors, for example, alkaline earth halogen apatite-based phosphors, and for yellow to green emitting phosphors, for example, yttrium aluminum garnet-based phosphors (YAG-based phosphors) and lutetium aluminum garnet-based phosphors (LAG-based phosphors) can be used. For green emitting phosphors, for example, chlorosilicate phosphors and β-SiAlON phosphors can be used. For red emitting phosphors, for example, SCASN-based phosphors such as $(Sr,Ca)AlSiN_3:Eu$, CASN-based phosphors such as $CaAlSiN_3:Eu$, $SrAlSiN_3:Eu$ phosphors, and KSF-based phosphors such as $K_2SiF_6:Mn$ can be used.

For example, for lighting purposes, employing blue light emitting elements for the first light emitting elements 1 and the second light emitting element 2, two types of phosphors, i.e., YAG-based and SCASN-based phosphors for the first phosphor particles and a YAG-based phosphor for the second phosphor particles, allows the first emission parts that include the first light emitting elements 1 to have a color temperature of the about 2700K and the second emission parts that include the second light emitting elements 2 to have a color temperature of about 6500K, thereby producing a light emitting device capable of emitting light by mixing these colors of about 2700K to about 6500K. By changing the element-phosphor combination and the ratio, various color temperature ranges between 1800K and 6500K can be selected.

Phosphor Layer

Examples of the phosphor layer 11 include those employing a light transmissive material, such as a resin, glass, or inorganic material as a binder for phosphors formed on the surface of a light transmitting part 12. The phosphor layer 11 may be a single layer containing one or more types of phosphor particles. The phosphor layer 11 may be one made by stacking a layer containing phosphor particles of one type and another layer containing phosphor particles of the same or a different type. The phosphor layer 11, moreover, may contain a diffuser as needed. The phosphor layer 11 is preferably formed to be larger than the upper face area of a first light emitting element 1, and in this case, the phosphor layer 11 is preferably disposed on a first light emitting element 1 so that the lower surface of the phosphor layer 11 is exposed annularly around the upper face of the light emitting element.

The phosphor layer 11 is formed on the surface of a light transmitting part 12, for example, by printing. Here, the phosphor layer 11 in any of the embodiments of the present invention includes not only one that is in direct contact with the surface of a light transmitting part 12, but also one bonded via another material such as an adhesive. Examples of methods for bonding the phosphor layer 11 to the surface of a light transmitting part 12 include pressure bonding, fusing, sintering, bonding using an organic adhesive, and bonding using an inorganic adhesive such as a low-melting point glass. For the method for forming the phosphor layer 11, compression molding, phosphor electrodeposition, phosphor sheet method, or the like can be used besides printing. In forming a phosphor layer by printing, a paste containing a phosphor, a binder, and a solvent is prepared, which is then applied to the surface of a light transmitting part and dried. For the binder, organic resin binders such as epoxy resins, silicone resins, phenol resins, or polyimide resins, or inorganic binders such as glass can be used. Compression molding is a method that forms a phosphor layer composed of a phosphor-containing binder on the surface of a light transmitting part using a mold. Phosphor electrodeposition is a method that utilizes electrophoresis to allow charged phosphors to deposit on a conductive transmissive thin film formed on the surface of a light transmitting part. A phosphor sheet method is a method of preparing a phosphor sheet by kneading a resin material such as a silicone resin and a phosphor which is integrated with a light transmitting part by pressure bonding.

Here, the thickness of the phosphor layer 11 is set, for example, to 0.2 to 1.5 times, preferably 0.5 to 1 times, the thickness of a light transmitting part. The thickness of the phosphor layer 11 is preferably 35 to 200 μm, more preferably 80 to 150 μm. When the thickness of the phosphor layer is larger than 200 μm, heat dissipation properties tend to decline. From a heat dissipation perspective, the thinner the phosphor layer the more preferable it is. An excessively small thickness, however, reduces the phosphor content which tends to narrow the chromaticity range of the light being obtained. The phosphor layer is adjusted to an appropriate thickness by taking these into consideration.

Light Transmitting Part

The light transmitting part 12 is a member disposed separately from the phosphor layer that contains phosphor particles, and is a member that supports the phosphor layer 11 formed on the surface. A sheet material made of an inorganic material such as glass can be used for the light transmitting part 12. For a glass material, for example, borosilicate glass or quartz glass can be selected. The light transmitting part 12 can simply have a thickness that would not allow the mechanical strength to decline during the manufacturing process, and can impart adequate mechanical strength to the phosphor layer 11. For example, the thickness of the light transmitting part 12 can be set to 80 μm to 200 μm. The upper face of a light transmitting part 12 can be positioned higher than the upper face of a second light emitting element 2 as shown in FIG. 2, and other drawings. In this manner, for example, a wavelength conversion member can be selectively disposed around a second light emitting element by pouring a light transmissive material containing a wavelength conversion material to a height lower than while avoiding the upper face of the light transmitting part. It's not limited to this, however, and the thicknesses of a light emitting element may be varied such that the upper face of a light transmitting part 12 has the same height as, or smaller than, the upper face of a second light emitting element 2. Any of these can reduce the wavelength conversion member in the optical paths of the emitted light from the second light emitting elements 2, thereby reducing the unevenness in color of the light output by the device.

The outline of the light transmitting part 12 is preferably larger than the outline of a light emitting element. In this manner, when a phosphor layer is formed on the entire principal surface of a light transmitting part and the phosphor layer 11 is placed on the upper face of a light emitting element, the phosphor layer can securely be disposed on the entire upper face of the light emitting element even if there is a slight mounting accuracy deviation. The size of a light transmitting part 12 in a plan view can be set, for example, to about 120% to about 160% of the area of a first light emitting element 1.

Furthermore, the light transmitting parts 12 may contain a diffuser. The diffuser can attenuate color unevenness that might occur when the phosphor concentration in the phosphor layer 11 is reduced. For the diffuser, titanium oxide, barium titanate, aluminum oxide, silicon oxide, or the like can be used. The lateral faces of the light transmitting parts 12 preferably have rough surfaces. The rough or irregular lateral faces of the light transmitting parts 12 can, for example, scatter the light from the second light emitting elements 2, thereby improving the color mixing quality and effectively reducing color unevenness of the light emitting device as a whole. In this case, moreover, having the light transmitting part 12 contain a diffuser can more effectively reduce color unevenness of the light emitting device as a whole. Furthermore, the upper face of a light transmitting part 12 which will become the main emission face of a first emission part is not limited to a flat face, and may have micro-projection and micro-recesses. This can facilitate scattering of the light output from the upper faces of the light transmitting parts 12 to thereby further attenuate luminance unevenness or color unevenness of the light emitting device as a whole.

Reflecting Member

It is preferable to use an insulation material containing a reflecting filler for the reflecting member 7. For the insulation material, for example, a thermosetting resin, thermoplastic resin, or the like can be used. The reflecting member 7 can be formed by employing, for example, a resin containing one or more of silicone resin, modified silicone resin, epoxy resin, modified epoxy resin, acrylic resin, phenol resin, BT resin, and PPA, or a hybrid resin, together with a light reflecting material. Among all, a resin containing as a base polymer a silicone resin, which is highly heat resistant and has electrical insulation qualities and flexibility, is preferable. Examples of reflecting fillers include titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, mullite, and the like. Among all, titanium oxide is preferable because it is relatively stable against moisture and has a high refractive index.

Bonding Member

The bonding members 40 are required to have light transmissivity to effectively guide the emitted light from the first light emitting elements 1 into the phosphor layer 11. Specific examples of light transmissive bonding members 40 include organic resins, such as epoxy resins, silicone resins, phenol resins, and polyimide resins, where silicone resins are preferable. The smaller the thickness of the bonding members 40 between the first light emitting elements 1 and the phosphor layer 11, the more preferable it is. Bonding members 40 having a small thickness can facilitate heat dissipation and reduce optical transmission loss, thereby increasing the emission efficiency of the light emitting device.

The bonding members 40 preferably are formed not only between the first light emitting elements 1 and the phosphor layer 11, but also on the lateral faces of the first light emitting elements 1 forming fillets 41. The fillets 41 reflect the light output from the lateral faces of the first light emitting elements 1 and allow the light to enter the phosphor layer 11 to increase the wavelength conversion efficiency of the phosphor layer 11. As described earlier, by allowing the fillets 41 to reflect the light from the second light emitting elements 2, contributions can be made in improving the color mixing quality. Here, a fillet is a part having a triangular cross section that decreases in size downwards from the light emitting element side. The fillets 41 can be formed by adjusting the amount of bonding members when bonding the first light emitting elements 1 to the phosphor layer 11. In the case of using a silicone resin as a binder for the phosphor layer 11, it is preferable to also use a silicone resin for the bonding member 40. This can reduce the refractive index difference between the phosphor layer 11 and the bonding members 40, thereby increasing the light entering the phosphor layer 11.

Light Transmissive Sealing Resin and Sealing Resin

The light transmissive sealing resin 20 and sealing resin 22 are preferably made of a material having electrical insulation properties that can transmit the emitted light from the light emitting elements, and has fluidity before being solidified. For the sealing resin, a light transmissive resin having transmissivity of at least 70% is preferably selected. Examples of light transmissive resins include silicone resins, silicone modified resins, epoxy resins, phenol resins, polycarbonate resins, acrylic resins, TPX, polynorbornene resins, or hybrid resins containing one or more of these resins. Among all, silicone resins are preferable because they are highly heat resistant and light resistant, and has minimal volume contraction after solidification.

The sealing resin 22 may further contain additives such as a filler, diffuser, or the like, in addition to the second phosphor particles. Examples of diffusers include $SiO_2$, $TiO_2$, and the like.

Base 30

The base 30 is bears the first light emitting elements 1, the second light emitting elements 2 and, as needed, a protective device or the like, mounted thereon, and has first wiring 31 and second wiring 32 on its upper face. A frame 33 is further disposed on the base. The base 30 is formed, for example, as a quadrilateral sheet as shown in FIG. 1 and FIG. 2, and the size of the base 30 is suitably set in accordance with the number of light emitting elements to be arranged, the purpose, and the application.

For the base 30, an insulation material that does not readily transmit the light emitted by the light emitting elements or the external light is preferably used.

Specific examples include ceramics ($Al_2O_3$, AlN, or the like) and resins such as phenol resins, epoxy resins, polyimide resins, BT resin, and polyphthalamide (PPA). In order to increase the reflectivity, a reflecting member may be disposed on the light emitting element mounting face. The reflecting member, for example, is one made by kneading reflecting particles such as $TiO_2$ and an organic or inorganic binder. So-called white resists, white inks, and ceramics inks fall under this category. For an organic binder, it is particularly preferable to use a silicone resin which is highly heat resistant and light resistant. In this manner, light is reflected by the base surface to thereby provide a light emitting device having high light extraction efficiency.

First and Second Wiring

The first wiring and the second wiring (hereinafter simply referred to as wiring), as described earlier, are electrically connected to the light emitting elements disposed on the base and a protective device disposed as needed to apply a voltage from an external power supply. The wiring is constructed with metal members, and the material employed for the metal members is not particularly limited. In the case of employing a ceramic material for the base 30, for example, a metal or alloy having as a main component W, Mo, Ti, Ni, Au, Cu, Ag, Pd, Rh, Pt, Sn or the like can be used. The wiring can be formed by vapor deposition, sputtering, printing, or the like, followed by plating applied thereon. From the perspective of minimal degradation and good adhesion with the bonding members, it is preferable to apply a metal having Au as a main component as the outermost layer of the wiring by plating or the like. The thickness of the wiring is not particularly limited, and can be suitably set by taking into consideration the number of light emitting elements to be mounted, the input power, and the like.

The first wiring 31 and the second wiring 32 are formed on the upper face of the base 30. The separated parts of the first wiring 31 can be connected using a wire spanning over the second wiring 32, and the separated parts of the second wiring 32 can be connected using a wire spanning over the first wiring 31 as needed.

First and Second Light Emitting Elements

The first light emitting elements 1 and the second light emitting elements 2 (hereinafter simply referred to as light emitting elements) are semiconductor elements that emit light when a voltage is applied.

The light emitting elements may each have a polygonal planar shape, such as substantially quadrilateral, substantially hexagonal, or the like, as shown in FIG. 1 and other drawings. The emission wavelengths of the light emitting elements are suitably selected by taking into consideration the application, the excitation wavelength of the first phosphor particles 11b contained in the phosphor layer 11, the excitation wavelength of the second phosphor particles 21 contained in the light transmissive sealing resin 20, and the like. For example, ZnSe, nitride semiconductor, GaP, or the like can be used for a blue light emitting elements (wavelength ranging from 430 to 490 nm) and green light emitting elements (wavelength ranging from 490 to 570 nm). For red light emitting elements (wavelength ranging from 620 to 750 nm), GaAlAs, AlInGaP, or the like can be used. With respect to the light emitting device of Embodiment 1, in the case of constructing a white light emitting device, for example, nitride semiconductor blue light emitting elements are preferably used. Moreover, light emitting elements emitting ultraviolet or infrared light may be selected besides those emitting visible light.

The light emitting elements employed for the first light emitting elements 1 may have the emission wavelength that is the same as or different from that of the light emitting elements employed for the second light emitting elements 2.

In explaining the light emitting devices of the embodiments, examples in which the number of first light emitting elements 1 was equal to the number of second light emitting elements 2 have been shown, but the light emitting devices of the embodiments are not limited to those. The number of first light emitting elements 1 may differ from the number of second light emitting elements 2. Generally speaking, in the case of using LEDs for the light emitting elements, the lower the color temperature, the lower the emission efficiency results. For this reason, in the case where the color temperature of the second emission parts is lower than that of the first emission parts, for example, the luminance or emission efficiency balance can be adjusted by using a larger number of first light emitting elements 1 than that of second light emitting elements 2. In the case of varying (adjusting) the emission color in a small lighted region or the like, reducing the number of elements in the area where no luminance is needed can increase the number of elements in the other. This can increase the luminance and the emission efficiency of the light emitting device.

Frame 33

The frame 33 is preferably constructed with, for example, an insulation resin which contains a reflecting material. For the insulation resin, for example, a thermosetting resin, thermoplastic resin, or the like can be used. More specific examples include phenol resins, epoxy resins, BT resin, PPA, and silicone resins. In the case of mounting a non-emitting device such as a protective device which absorbs light, the device is preferably embedded in the light reflecting resin. The frame 33 can be formed, for example, by drawing while allowing a dispenser to eject a resin, resin printing, transfer forming, compression molding, or the like. The frame is formed to surround the light transmissive sealing resin. Providing a frame can reduce the top view shape variation of the light transmissive sealing resin in the case of forming the light transmissive sealing resin by coating. When an uncured light transmissive sealing resin is applied on the inside of the frame, the light transmissive sealing resin flows in the frame before being hardened. Surrounding the resin with the frame can prevent the light transmissive resin from flowing out of the frame. The light transmissive sealing resin applied is formed along the inner shape of the frame, thereby reducing top view shape variation of the light transmissive sealing resin.

The light emitting device according to the embodiments of the present invention can improve color mixing quality and reduce unevenness in the color of the light it outputs.

Obviously, numerous modifications and variations of the present invention are possible in light of the above teachings. It is therefore to be understood that within the scope of the appended claims, the invention may be practiced otherwise than as specifically described herein.

What is claimed is:
1. A light emitting device comprising:
a base;
a first light emitting element disposed on the base and having a top face and a bottom face opposite to the top face, the bottom face facing the base;
a second light emitting element disposed on the base;
a wavelength conversion member provided on the top face of the first light emitting element and comprising:
a light transmitting part made of an inorganic material and having an upper face and a lower face opposite to the upper face; and
a phosphor layer disposed between the lower face of the light transmitting part and the top face of the first light emitting element, the phosphor layer being bonded to the top face of the first light emitting element;

a reflecting member covering lateral faces of the phosphor layer; and a light transmissive sealing resin disposed on the base between the first light emitting element and the second light emitting element and between the wavelength conversion member and the second light emitting element, the light transmissive sealing resin covering the lateral faces of the phosphor layer via the reflecting member.

2. The light emitting device according to claim 1, wherein the base has first wiring and second wiring separated from one another, the first light emitting element being connected to the first wiring and the second light emitting element being connected to the second wiring.

3. The light emitting device according to claim 2, comprising:

a plurality of first light emitting elements serially connected via the first wiring; and a plurality of second light emitting elements serially connected via the second wiring.

4. A light emitting device comprising:
a first light emitting element;
a second light emitting element;
a wavelength conversion member comprising:
   a light transmitting part made of an inorganic material and having an upper face and a lower face; and
   a phosphor layer disposed on the lower face of the light transmitting part, the phosphor layer being bonded to the first light emitting element;
a reflecting member covering lateral faces of the phosphor layer, and
a light transmissive sealing resin disposed between the first light emitting element and the second light emitting element and between the wavelength conversion member and the second light emitting element, the light transmissive sealing resin supporting the first light emitting element, the wavelength conversion member, and the second light emitting element and covering the lateral faces of the phosphor layer via the reflecting member.

5. The light emitting device according to claim 1, wherein the light transmissive sealing resin covers an emission face of the second light emitting element and the upper face of the light transmitting part, the light transmissive sealing resin containing second phosphor particles.

6. The light emitting device according to claim 5, wherein the second phosphor particles are localized in the light transmissive sealing resin such that density of the second phosphor particles is higher on a side of the first light emitting element and a side of the second light emitting element.

7. The light emitting device according to claim 5, wherein the phosphor layer contains first red emitting phosphor particles and first green emitting phosphor particles, and the second phosphor particles contained in the light transmissive sealing resin include second red emitting phosphor particles and second green emitting phosphor particles.

8. The light emitting device according to claim 7, wherein the first red emitting phosphor particles and the second red emitting phosphor particles are made of a same phosphor material, and the first green emitting phosphor particles and the second green emitting phosphor particles are made of a same phosphor material.

9. The light emitting device according to claim 1, wherein the wavelength conversion member and the first light emitting element are bonded by a bonding member which contains a light reflecting filler, and wherein the reflecting member is formed by the bonding member which covers the lateral faces of the wavelength conversion member.

10. The light emitting device according to claim 1, comprising:

a plurality of first light emitting elements; and a plurality of second light emitting elements, the first light emitting elements and the second light emitting elements being arranged in rows and columns and being alternated in each row and each column.

11. The light emitting device according to claim 10, wherein the first light emitting elements and the second light emitting elements are each substantially quadrilateral and respectively arranged in a diagonal direction, the diagonally arranged columns of the first light emitting elements and the diagonally arranged columns of the second light emitting elements are alternately disposed.

12. The light emitting device according to claim 1, wherein a refractive index of the light transmitting part is higher than a refractive index of the light transmissive sealing resin.

13. The light emitting device according to claim 1, wherein a thickness of the phosphor layer is 0.2 to 1.5 times a thickness of the light transmitting part.

14. The light emitting device according to claim 1, wherein a thickness of the phosphor layer is 35 to 200 μm.

15. The light emitting device according to claim 1, further comprising:

a frame that surrounds the light transmissive sealing resin.

* * * * *